US007184330B2

(12) United States Patent
Tajima et al.

(10) Patent No.: US 7,184,330 B2
(45) Date of Patent: Feb. 27, 2007

(54) SEMICONDUCTOR MEMORY DEVICE

(75) Inventors: Kenichi Tajima, Akishima (JP); Hiroshi Akasaki, Ome (JP); Masatoshi Hasegawa, Hamura (JP); Yousuke Tanaka, Ome (JP)

(73) Assignees: Hitachi, Ltd, Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 11/137,583

(22) Filed: May 26, 2005

(65) Prior Publication Data
US 2005/0265091 A1    Dec. 1, 2005

(30) Foreign Application Priority Data
May 27, 2004    (JP) .............................. 2004-157191

(51) Int. Cl.
*G11C 29/00*    (2006.01)
(52) U.S. Cl. .................................. 365/200; 365/230.03
(58) Field of Classification Search ................ 365/200, 365/230.03, 207, 203, 194
See application file for complete search history.

(56) References Cited

U.S. PATENT DOCUMENTS 5,021,944 A    6/1991  Sasaki et al. ............... 365/200
5,715,189 A *  2/1998  Asakura ....................... 365/72
6,258,642 B1 * 7/2001  Holst .......................... 438/199
6,545,897 B2 * 4/2003  Fujisawa et al. .............. 365/63
6,567,290 B2 * 5/2003  Alexanian ..................... 365/63

FOREIGN PATENT DOCUMENTS

JP    2-21500     1/1990
JP    4-345998    12/1992

* cited by examiner

Primary Examiner—Anh Phung
(74) Attorney, Agent, or Firm—Miles & Stockbridge PC

(57) ABSTRACT

A semiconductor memory device capable of improving the reliability when driving a word line and capable of reducing the access delay due to the defect relief is provided. In order to prevent the multiple selection of a sub-word line of a normal memory mat and a sub-word line of a redundant memory mat, the start of the redundant memory mat is delayed from that of the normal memory mat, and in order to compensate the start delay, the shared circuit is eliminated and the bit line length is reduced in the redundant memory mat. By doing so, the read time of the bit lines is reduced and the signal amount is increased. Consequently, the same activation timing of the sense amplifier as that of the normal memory mat can be used also in the redundant memory mat.

5 Claims, 6 Drawing Sheets

SEMICONDUCTOR MEMORY DEVICE

CROSS-REFERENCE TO RELATED APPLICATION

The present application claims priority from Japanese Patent Application JP 2004-157191 filed on May 27, 2004, the content of which is hereby incorporated by reference into this application.

TECHNICAL FIELD OF THE INVENTION

The present invention relates to a semiconductor memory device. More particularly, the present invention relates to a technique effectively applied to a semiconductor memory device such as a dynamic RAM in which the high-speed operation is required also in a redundant memory array.

BACKGROUND OF THE INVENTION

According to the study by the inventors of the present invention, the technologies described below are known as the technologies for the defect relief in a memory.

For example, the method of the operation for the defect relief of a word line described below is known. That is, the address is first confirmed and the decoding is performed after the confirmation, and then, the normal word line or the redundant word line is activated. However, the operation speed is reduced due to the address confirmation in this method. For its prevention, the technologies described in Japanese Patent Application Laid-Open No. 2-21500 and 4-345998 have been developed.

For example, Japanese Patent Application Laid-Open No. 2-21500 discloses the memory device capable of reducing the access time delay in the read operation from the redundant memory array. More specifically, in the read operation of this memory device, the word line in the normal memory array and the redundant word line in the redundant memory array are simultaneously activated, and the relief or the non-relief is determined before each of the read data reaches the sense amplifier, and then, the data of the sense amplifier in accordance with the result of the determination is selected and outputted to the data bus. This memory device is particularly effective when applied to a static RAM (SRAM).

Also, Japanese Patent Application Laid-Open No. 4-345998 discloses the memory device capable of reducing the access delay due to the defect relief without remarkably increasing the power consumption and the circuit area. More specifically, in the operation of this memory device, only the normal word line is activated and the read data thereof is connected to the sense amplifier via a switch in the non-relief operation. Meanwhile, in the relief operation, the redundant word line provided in the memory mat different from that of the normal word line is activated together with the normal word line and only the read data of the redundant word line is connected to the sense amplifier via another switch. Note that this memory device is particularly effective when applied to the dynamic RAM (DRAM).

SUMMARY OF THE INVENTION

Incidentally, according to the study for the defect relief technology in a memory by the inventors of the present invention, the following facts have been found out.

For example, in the operating method described in Japanese Patent Application Laid-Open No. 2-21500, the access time delay due to the defect relief does not occur. However, since both of the normal word line and the redundant word line are activated every time, there is the possibility that the problems of the increase in the power consumption and the activation of the defective word line are caused.

Also, in the operating method described in Japanese Patent Application Laid-Open No. 4-345998, not only the problem that the defective word line may be activated in the relief operation similar to that described above but also the problem of the access time delay in the relief operation probably occurs.

Furthermore, when the memory speed is further increased, the possibility of the erroneous selection of the normal word line and the redundant word line resulting from the timing for determining the relief or the non-relief and the circuit type thereof will be increased in both cases of Japanese Patent Application Laid-Open No. 2-21500 and 4-345998.

In such a circumstance, an object of the present invention is to provide a semiconductor memory device capable of reducing the access delay due to the defect relief.

Also, another object of the present invention is to provide a semiconductor device capable of improving the reliability when driving a word line regardless of the defect relief and non-relief and capable of reducing the access delay due to the defect relief.

The above and other objects and novel characteristics of the present invention will be apparent from the description and the accompanying drawings of this specification.

The typical ones of the inventions disclosed in this application will be briefly described as follows.

A semiconductor memory device according to the present invention comprises: a memory mat including a first word line, a first bit line, and a memory cell; a redundant memory mat including a second word line, a second bit line, and a memory cell and relieving defects in the memory mat; a first sense amplifier region including a first sense amplifier for amplifying a signal of the first bit line and provided adjacent to the memory mat; and a second sense amplifier region including a second sense amplifier for amplifying a signal of the second bit line and provided adjacent to the redundant memory mat, wherein the second sense amplifier is not shared with the memory mat and the shared circuit is not provided in the second sense amplifier region.

More specifically, since the sense amplifier of the redundant memory mat is not shared with the memory mat, the configuration of the redundant memory mat is separated from that of the normal memory mat. Also, since the shared circuit is omitted in the sense amplifier of the redundant memory mat, the capacitance of the second bit line can be reduced, and as a result, the data read speed in the redundant memory mat can be increased.

Also, a semiconductor memory device according to the present invention comprises: a memory mat including a first word line, a first bit line, and a memory cell; and a redundant memory mat including a second word line, a second bit line, and a memory cell and relieving defects in the memory mat, wherein the second bit line is shorter than the first bit line.

Therefore, the read signal amount to the second bit line of the redundant memory mat can be increased, and thus, the data read speed in the redundant memory mat can be increased. Note that the read speed can be further increased by using the omission of the shared circuit described above together with the reduction of the second bit line length.

Also, a semiconductor memory device according to the present invention comprises: a memory mat including a first word line, a first bit line, and a memory cell; a redundant memory mat including a second word line, a second bit line, and a memory cell and relieving defects in the memory mat by replacing the first word line with the second word line; a first sense amplifier region including a first sense amplifier for amplifying a signal of the first bit line and provided adjacent to the memory mat; a second sense amplifier region including a second sense amplifier for amplifying a signal of the second bit line and provided adjacent to the redundant memory mat; a circuit for determining relief or non-relief by comparing an address inputted externally with a predetermined relief address; a first start signal for starting the memory mat when the result of the determination circuit is the non-relief; and a second start signal for starting the redundant memory mat when the result of the determination circuit is the relief, wherein means for delaying generation timing of the second start signal from generation timing of the first start signal is provided, and means for increasing read speed of the redundant memory mat is provided so as to compensate the delay of the second start signal.

Therefore, the malfunction of the multiple selection caused by activating the normal memory mat and the redundant memory mat at the same time can be prevented, and the drive operation of the word line with high reliability can be realized. In addition, it is also possible to keep the same access time in the normal memory mat and the redundant memory mat.

The effect obtained by the representative one of the inventions disclosed in this application will be briefly described as follows. That is, the high-speed operation of a semiconductor memory device can be realized.

BRIEF DESCRIPTIONS OF THE DRAWINGS

FIG. 4 is a diagram showing an example of the layout of the sense amplifier region in the semiconductor memory device shown in FIG. 3, in which

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Also, in the description of the embodiment, a configuration example of a semiconductor memory device according to an embodiment of the present invention will be first described with reference to FIGS. 1 to 4, and then, an operation example of the semiconductor device will be described next with reference to FIGS. 5 and 6. In this case, the main characteristic of the present invention lies in the configuration of memory mat and the sense amplifier region described later with reference to FIGS. 3 and 4 and the operating method including the memory mat and the sense amplifier region described later with reference to FIGS. 5 and 6.

Figure 1:
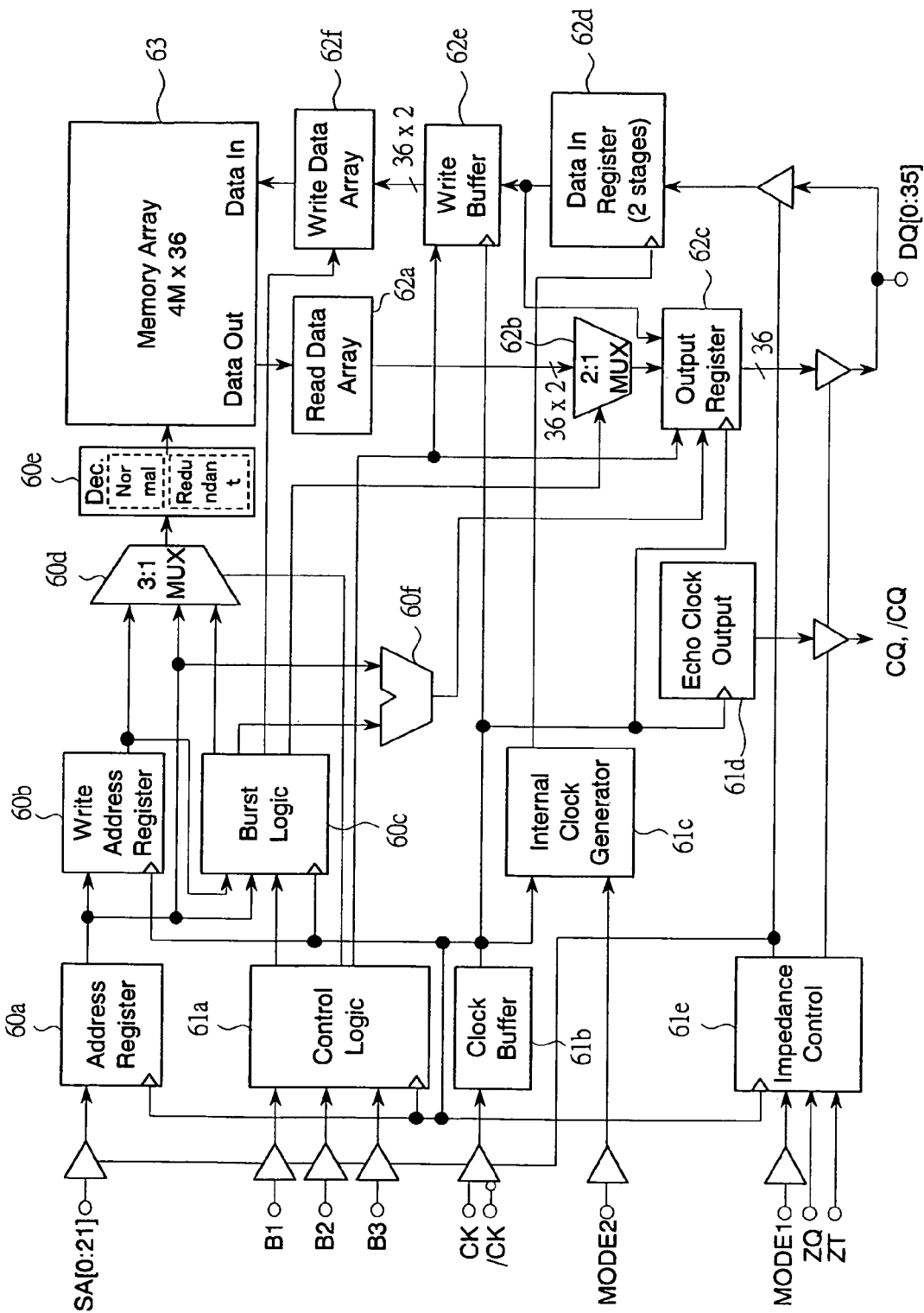
FIG. 1 is a block diagram showing an example of the entire configuration of a semiconductor memory device according to an embodiment of the present invention.

FIG. 1 is a block diagram showing an example of the entire configuration of a semiconductor memory device according to an embodiment of the present invention. The semiconductor memory device shown in FIG. 1 is comprised of, for example, a memory array 63 including a plurality of DRAM memory cells, a block group for controlling commands to the memory array 63, a block group for controlling addresses, and a block group for controlling data.

The block for controlling commands includes a control circuit 61a, a clock buffer 61b, an internal clock generator circuit 61c, a clock output circuit 61d, and an impedance control circuit 61e.

The control circuit 61a receives the commands from external control terminals B1, B2, and B3 and performs the overall control of each internal block. The clock buffer 61b receives the clock signal from the external clock terminals CK and /CK and supplies the clock signals to each internal block. The internal clock generator circuit 61c receives the clock signal from the clock buffer 61b and generates the internal clock signal in accordance with the input of external setting terminal MODE2. The clock output circuit 61d receives the clock signal from the clock buffer 61b and outputs the clock signals CQ and /CQ to be the strobe signals to the outside. The impedance control circuit 61e controls the impedance of each external I/O buffer in accordance with the input of the external setting terminals MODE1, ZQ, and ZT.

The block group for controlling addresses includes, for example, an address register 60a, a write address register 60b, a burst control circuit 60c, a multiplexer 60d, a decoder circuit 60e, and an address comparator circuit 60f.

The address register 60a latches the input address from the external address terminal SA [0:21]. The write address register 60b receives the output of the address register 60a and holds the address at the time of write command. The burst control circuit 60c receives the outputs of the address register 60a and the write address register 60b and generates the address at the time of the burst operation under the control of the control circuit 61a. The multiplexer 60d selects one address from the address register 60a, the write address register 60b, or the burst control circuit 60c under the control of the control circuit 61a and outputs the selected address. The decoder circuit 60e decodes the address from the multiplexer 60d and outputs to the memory array 63. The address comparator circuit 60f compares the address from the address register 60a and the address from the burst control circuit 60c and determines the matching/mismatching.

The block group for controlling data includes, for example, a read data array 62a, a multiplexer 62b, a data output register 62c, a data input register 62d, a write buffer 62e, and a write data array 62f.

The read data array 62e stores parallel data read from the memory array 63. The multiplexer 62b converts the parallel data from the read data array 62a into serial data under the control of the burst control circuit 60c and output the serial data. That is, it is compliant with the double data rate (DDR) system. The data output register 62c outputs the serial data from the multiplexer 62b to the external data terminal DQ [0:35] under the control of the control circuit 61a in the DDR system. The data input register 62d stores the serial data of the DDR system inputted from the external data terminal DQ [0:35]. The write buffer 62e converts the serial data from the data input register 62d into the parallel data. The write data array 62f stores the parallel data from the write buffer 62e and outputs the parallel data to the memory array 63 under the control of the burst control circuit 60c.

Note that the write address register 60b is provided in order to enable the operation in which a predetermined delay is introduced between the input of write command and write address and the input of write data. Also, the address comparator circuit 60f is provided in order to perform the function to output the data of the data input register 62d via the data output register 62c when the read command is generated to the same address after the write command.

Figure 2:
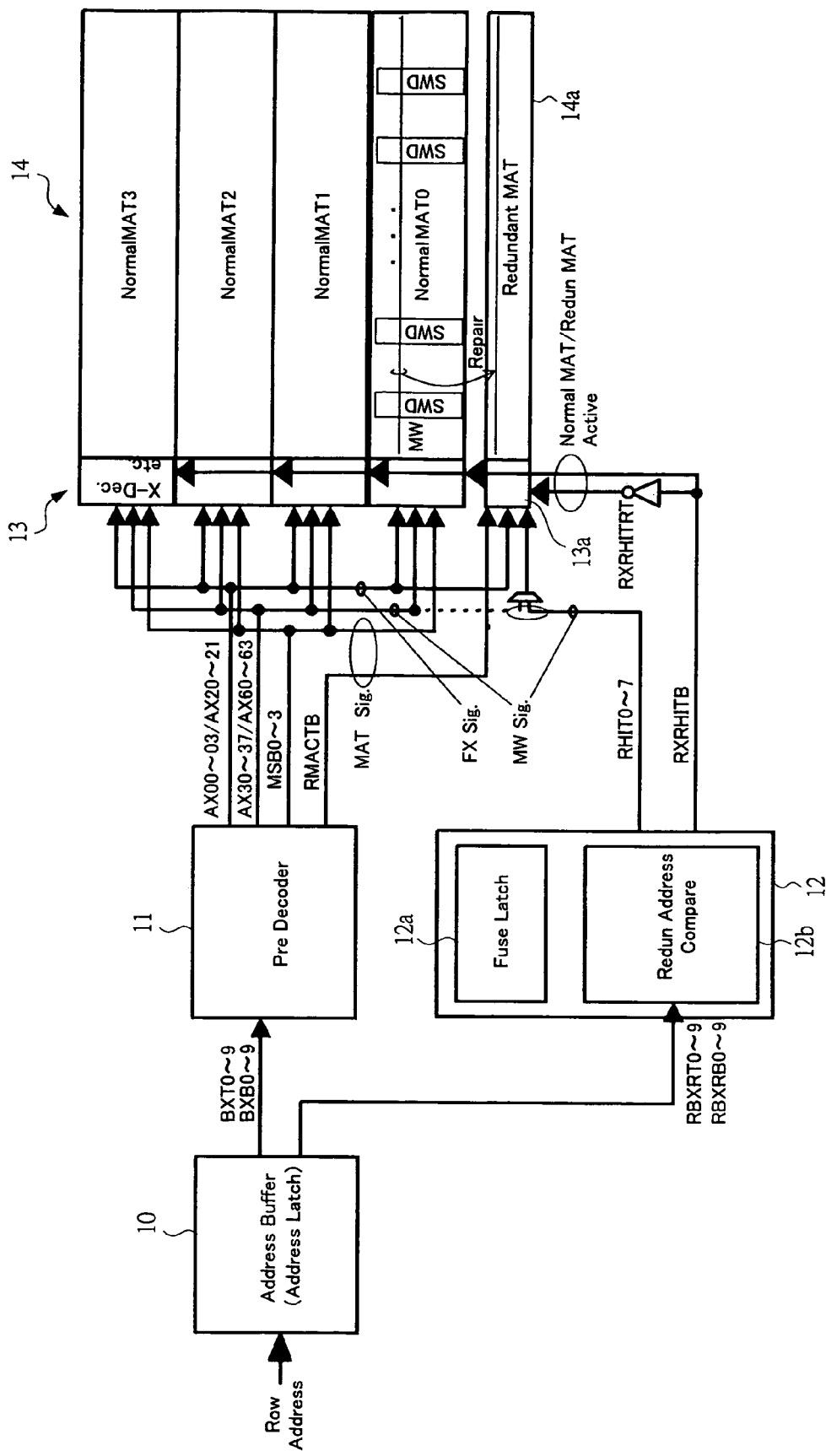
FIG. 2 is a block diagram showing an example of the configuration relative to the defect relief in the semiconductor memory device shown in FIG. 1.

In the configuration described above, the memory array 63 is provided with a plurality of memory mats including the redundant memory mat, and the configuration of parts for performing the function of the defect relief such as the memory array 63 and the decoder circuit 60e is as shown in FIG. 2.

FIG. 2 is a block diagram showing an example of the configuration relative to the defect relief in the semiconductor memory device shown in FIG. 1. The semiconductor memory device shown in FIG. 2 is comprised of, for example, an address buffer 10 to which the row address is inputted, a predecoder circuit 11 and a relief determination circuit 12 to which the output of the address buffer 10 is inputted, a plurality of row decoder circuits 13 and 13a to which the outputs of the predecoder circuit 11 and the relief determination circuit 12 are inputted, and a plurality of memory mats 14 and 14a controlled by the plurality of row decoder circuits 13 and 13a.

In FIG. 2, four normal memory mats (Normal MAT0 to Normal MAT3) 14 and one redundant memory mat (Redundant MAT) 14a are shown as the memory mat. Each of the memory mats 14 and 14a has a layered word line structure in which a plurality of sub-word drivers SWD are controlled by one main word line MW.

Though not shown, the sub-word line SWL extends from the sub-word driver SWD and the memory cell MC is connected to the sub-word line SWL. Also, a region including the sense amplifier SA is provided between respective memory mats though not shown. Note that, in FIG. 2, the defect in the normal memory mat 14 is relieved by replacing the corresponding main word line MW with the main word line MW in the redundant memory mat 14a.

The predecoder circuit 11 receives the signal from the address buffer 10 and outputs, for example, the selection signals (MSB0 to MSB3) of the normal memory mat 14, the selection signal (RMACTB) of the redundant memory mat 14a, the selection signals (AX30 to AX37/AX60 to AX63) of the main word line MW to the normal memory mat 14, and the selection signals (AX00 to AX03/AX20 to AX21) of the sub-word line SWL to the normal memory mat 14 and the redundant memory mat 14a.

The relief determination circuit 12 includes, for example, a fuse circuit 12a and a relief address comparator circuit 12b. The address in which the relief is required in the normal memory mat 14 is set in the fuse circuit 12a, and the address set in the fuse circuit 12a is compared with the address inputted from the address buffer 10 in this relief address comparator circuit 12b. Then, the relief determination circuit 12 outputs, for example, the selection signal (RHIT0 to RHIT7) of the main word line MW to the redundant memory mat 14a and the activation/inactivation signal (RXRHITB) to the redundant memory mat 14a and the normal memory mat 14 in accordance with the result of the address comparison.

Note that the activation/inactivation signal to the redundant memory mat 14a and the normal memory mat 14 functions exclusively, that is, when the activation signal is outputted to one memory mat, the inactivation signal is outputted to the other memory mat. Also, a function to select the selection signal (RHIT0 to RHIT7) of the redundant main word line MW or the selection signal (AX30 to AX37/AX60 to AX 63) of the main word line MW to the normal memory mat 14 as the input signal to the redundant memory mat 14a is provided by the selector in FIG. 2. This function is used to test the inside of the redundant memory mat 14a by using the signal for the normal memory mat 14.

Figure 3:
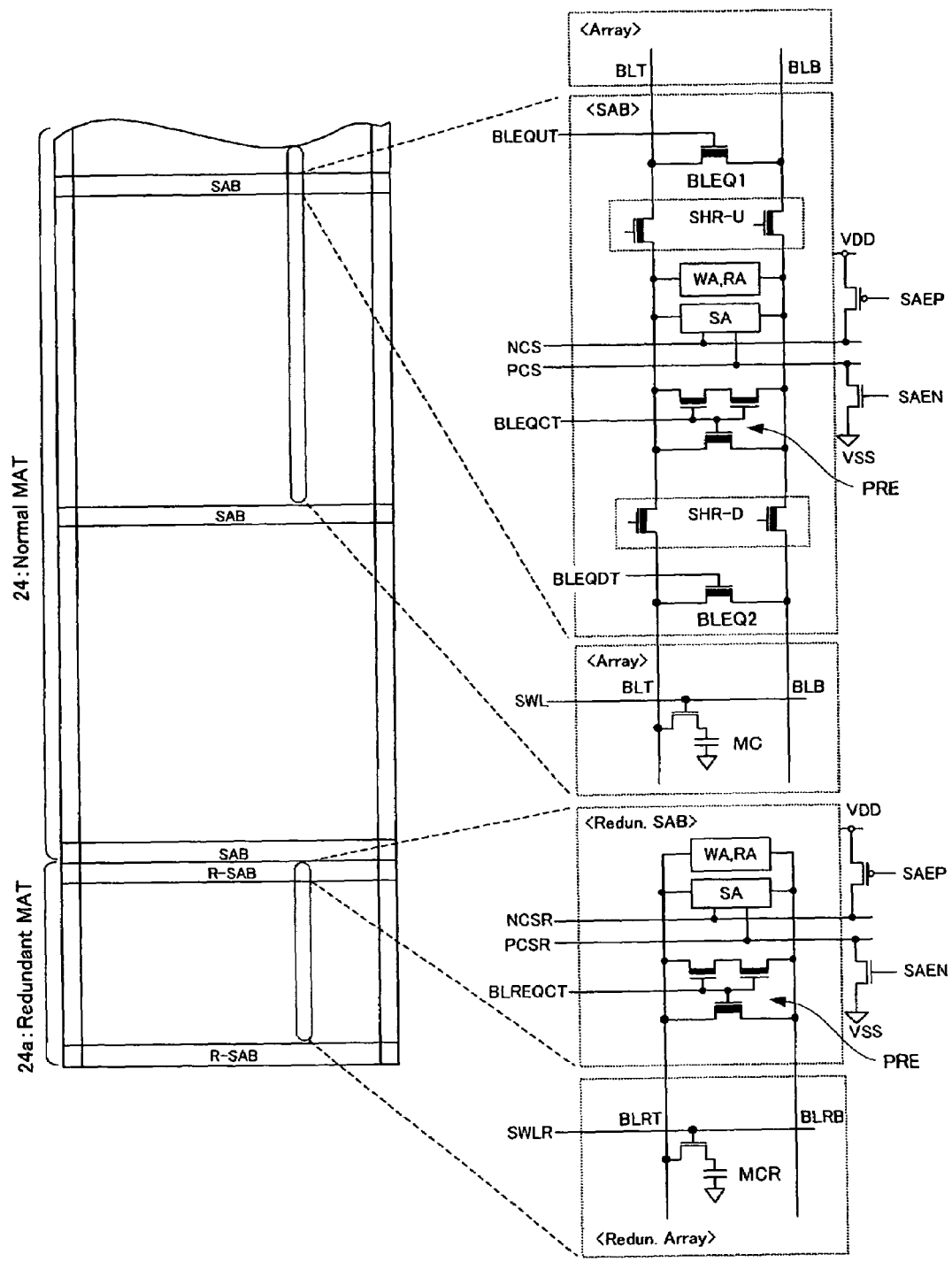
FIG. 3 is a diagram showing an example of the layout configuration of the normal memory mat and redundant memory mat including the sense amplifier region and an example of the circuit in the sense amplifier region in the semiconductor memory device shown in FIG. 2.

In the configuration described above, the sense amplifier region of the normal memory mat 14 and the redundant memory mat 14a has the configuration as shown in FIG. 3. FIG. 3 is a diagram showing an example of the layout configuration of the normal memory mat and redundant memory mat including the sense amplifier region and an example of the circuit in the sense amplifier region in the semiconductor memory device shown in FIG. 2.

FIG. 3 shows a plurality of normal memory mats 24 provided between the sense amplifier regions SAB and sharing the sense amplifier region SAB and one redundant memory mat 24a provided between sense amplifier regions R-SAB. In this case, the configuration of the redundant memory mat 24a is separated from that of the normal memory mat 24. More specifically, two sense amplifier regions SAB and R-SAB corresponding to each of the memory mats are provided between the normal memory mat 24 and the redundant memory mat 24a, which is different from the configuration in which one sense amplifier region SAB located between the normal memory mats 24 is shared by the adjacent normal memory mats 24.

In addition, the bit lines in the normal memory mat 24 and the redundant memory mat 24a are alternately connected to the two sense amplifier regions adjacent to the memory mats. Also, the length of the bit line in the redundant memory mat 24a is made shorter than that of the bit line in the normal memory mat 24 for the purpose of increasing the read signal amount when the bit line is used. For example, the length of the bit line in the redundant memory mat 24a is about one-fourth that of the bit line in the normal memory mat 24.

In the layout configuration described above, the sense amplifier region SAB between the normal memory mats 24 is comprised of, for example, a bit line pair BLT and BLB extending to the adjacent two normal memory mats 24, a read amplifier RA and a write amplifier WA for reading and writing data from and to the bit line pair BLT and BLB, a sense amplifier SA for amplifying the data of the bit line pair BLT and BLB, a precharge circuit PRE for precharging the bit line pair BLT and BLB, two shared circuits SHR-U and SHR-D provided so as to interpose these amplifiers RA, WA, and SA and the precharge circuit PRE therebetween and separate one of the adjacent two normal memory mats 24, and equalizer circuits BLEQ1 and BLEQ2 each provided between the shared circuit SHR-U and the normal memory mat 24 and between the shared circuit SHR-D and the normal memory mat 24 so as to short the bit line pair BLT and BLB.

Also, common source lines PCS and NCS for supplying each voltage of the pull-up side and the pull-down side are connected to the sense amplifier SA, and power supply voltage VDD and reference potential VSS are supplied to the common source lines PCS and NCS by sense amplifier enable signals SAEP and SAEN, respectively. Further, a memory cell MC is provided at the intersection between the sub-word line SWL and the bit line BLT in the normal memory mat 24.

Meanwhile, when compared with the circuit configuration of the sense amplifier region SAB of the normal memory mat 24 described above, the circuit configuration of the sense amplifier region R-SAB of the redundant memory mat 24a does not include the shard circuit and the equalizer circuit. Particularly, the sense amplifier region R-SAB of the redundant memory mat 24a is characterized in that the shared circuit is not provided. In FIG. 3, the configuration of the redundant memory mat 24a is separated from that of the normal memory mat 24 so as to omit the shared circuit. Since the shared circuit is omitted, the bit line capacitance can be reduced.

Note that the other configuration of the sense amplifier region R-SAB of the redundant memory mat 24a is similar to that of the sense amplifier region SAB of the normal memory mat 24 described above. That is, the write amplifier WA, the read amplifier RA, the sense amplifier SA, and the precharge circuit PRE are provided to the redundant bit lines BLRT and BLRB. Also, redundant common source lines NCSR and PCSR are connected to the sense amplifier SA, and a redundant memory cell MC is provided at the intersection between the redundant sub-word line SWLR and the redundant bit line BLRT in the redundant memory mat 24a.

Figure 4A:
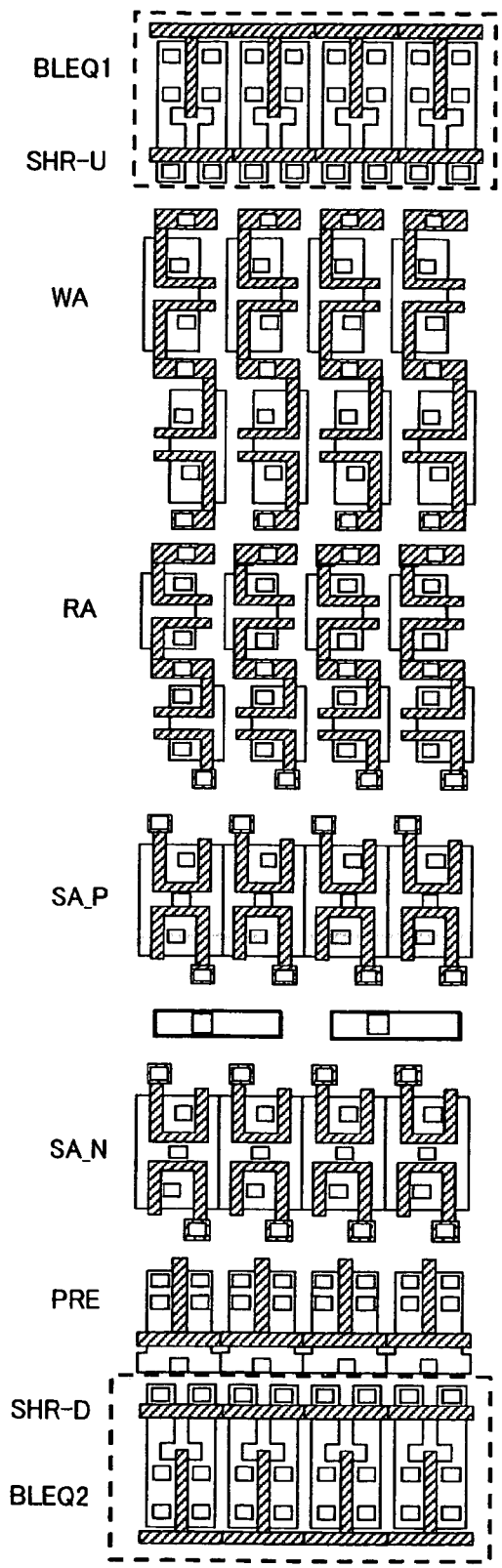
FIG. 4A is a layout diagram of the sense amplifier region of the normal memory mat and FIG. 4B is a layout diagram of the sense amplifier region of the redundant memory mat.
Figure 4B:
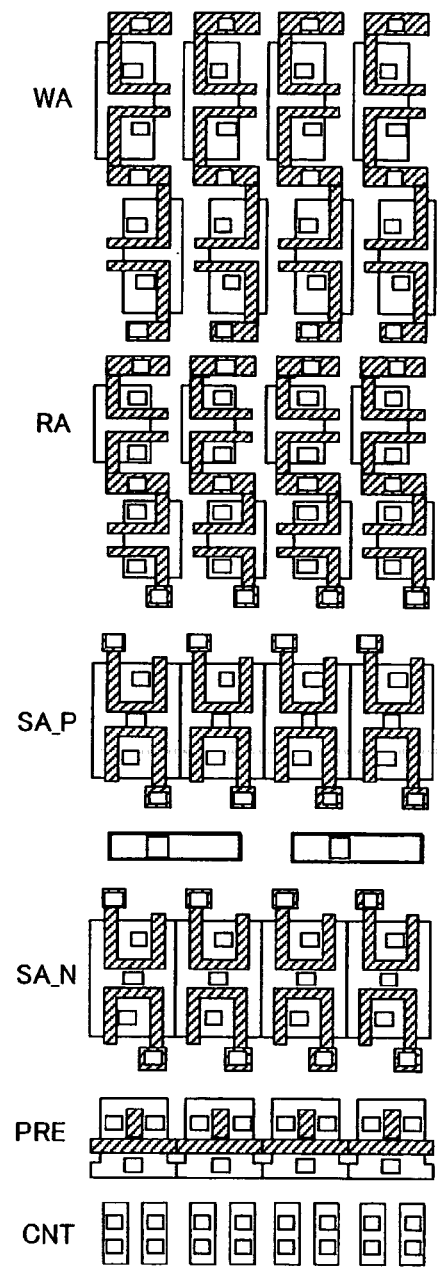

FIG. 4 is a diagram showing an example of the layout of the sense amplifier region in the semiconductor memory device shown in FIG. 3, in which FIG. 4A is a layout diagram of the sense amplifier region of the normal memory mat and FIG. 4B is a layout diagram of the sense amplifier region of the redundant memory mat.

As shown in FIG. 4A, in the layout of the sense amplifier region SAB of the normal memory mat 24 shown in FIG. 3, the equalizer circuit BLEQ1 and the shared circuit SHR-U, the write amplifier WA, the read amplifier RA, the sense amplifier SA_P on the pull-up side, the sense amplifier SA_N on the pull-down side, the precharge circuit PRE, and the shared circuit SHR-D and the equalizer circuit BLEQ2 are arranged in a line.

Meanwhile, as shown in FIG. 4B, in the layout of the sense amplifier region R-SAB of the redundant memory mat 24a shown in FIG. 3, the write amplifier WA, the read amplifier RA, the sense amplifier SA_P on the pull-up side, the sense amplifier SA_N on the pull-down side, and the precharge circuit PRE are arranged in a line, and the shared circuits SHR-U and SHR-D and the equalizer circuits BLEQ1 and BLEQ2 described above are not provided. Therefore, the circuit area of the sense amplifier region R-SAB can be reduced by that much in comparison to that of the sense amplifier region SAB.

Also, in the sense amplifier region R-SAB, the bit lines BLRT and BLRB (not shown) extending to the redundant memory mat 24a are connected ahead of the precharge circuit PRE of FIG. 4B. However, in FIG. 4B, since the phase shift is used to form the bit lines BLRT and BLRB, a contact region CNT is provided ahead of the precharge circuit PRE.

Next, the operation of the semiconductor memory device described with reference to FIGS. 1 to 4 will be described.

Figure 5:
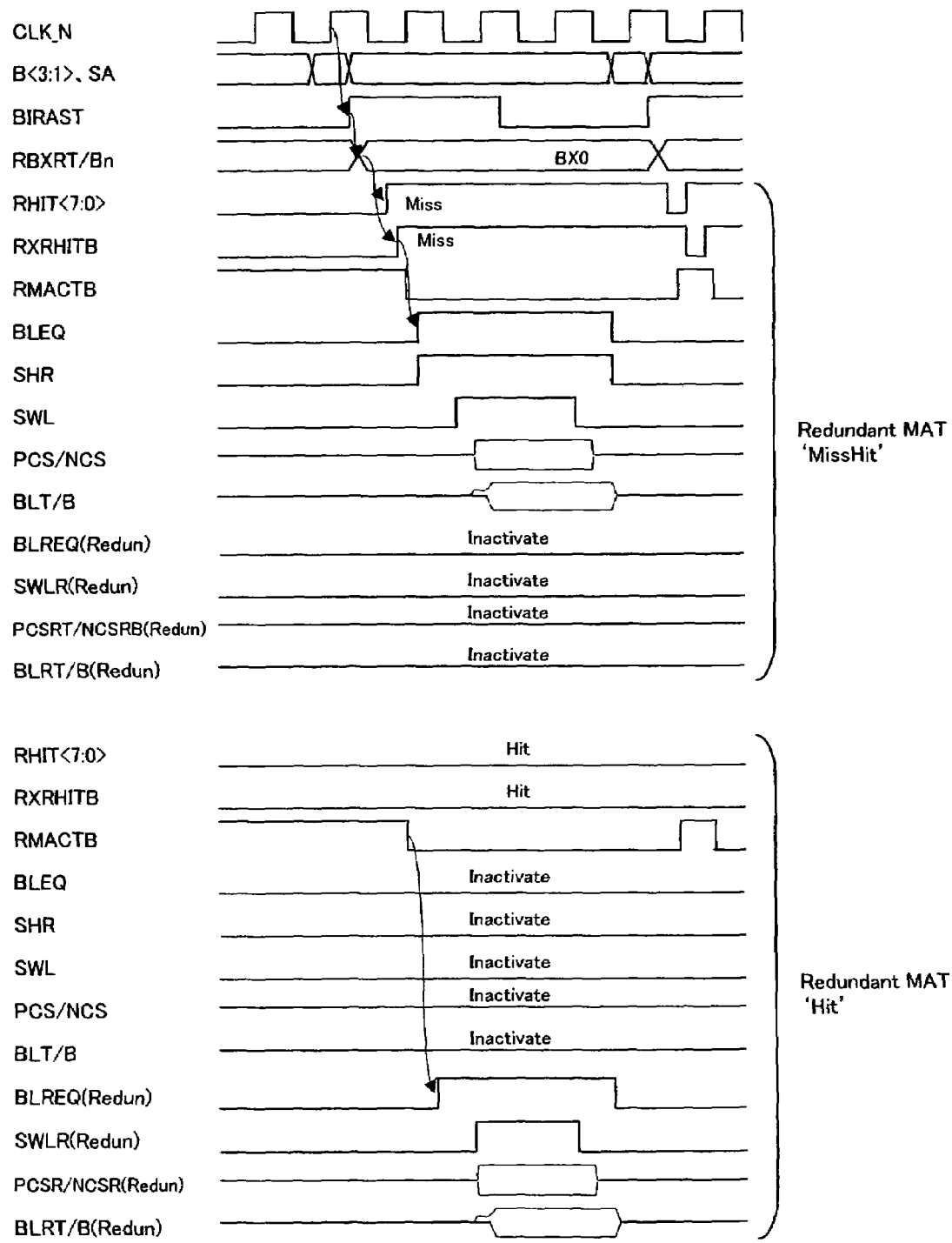
FIG. 5 is a waveform diagram showing an example of the operation relative to the defect relief in the semiconductor memory device shown in FIGS. 1 to 4.

FIG. 5 is a waveform diagram showing an example of the operation relative to the defect relief in the semiconductor memory device shown in FIGS. 1 to 4. FIG. 5 shows the two types of internal operation waveform after the clock signal CLK_N, the control signals B1 to B3 to be the read command, and the read address signal SA [0:21] are inputted from the external terminal of FIG. 1 and the row address clock signal BIRAST and the address signal RBXRT/Bn directed to the relief determination circuit 12 from the address buffer 10 of FIG. 2 are generated in the semiconductor memory device. Of the two types of internal operation waveform, the first is the case where there is no defect relief (MissHit) and the second is the case where there is the defect relief (Hit).

First, when there is no defect relief, the address comparison is performed in the relief determination circuit 12 of FIG. 2. As a result, the selection signal RHIT <7:0> of the redundant main word line is changed from the 'L' (Hit) output to the 'H' (MissHit) output. Note that, in the default state, this signal is the 'L' (Hit) output. Then, by this 'H' (MissHit) output, the activation/inactivation signal RXRHITB from the relief determination circuit 12 to the memory mat is changed to the 'H' (MissHit) output, and thus, the redundant memory mat 14a is inactivated and the normal memory mat 14 is activated.

At the same time, the predecoder circuit 11 of FIG. 2 receives the address signal BXT/Bn directed from the address buffer 10 to the predecoder circuit 11 and decodes the address. Then, the predecoder circuit 11 outputs the selection signal RMACTB of the redundant memory mat 14a at the timing certainly delayed from the output of the activation/inactivation signal RXRHITB of the relief determination circuit 12 described above.

Then, when the activation/inactivation signal RXRHITB becomes the 'H' (MissHit) output, only the normal memory mat 14 is started by using it as the start signal (first start signal), and the equalizer signal BLEQ of the bit line pair BLT and BLB and the control signal of the shared circuits SHR-U and SHR-D are driven. Thereafter, in the normal memory mat 14, the sub-word line SWL is activated, the sense amplifier SA is activated by driving the common source lines PCS and NCS of the sense amplifier SA, and the data of the bit line pair BLT and BLB is amplified.

Meanwhile, when there is the defect relief, the address comparison is performed in the relief determination circuit 12 of FIG. 2. As a result, the selection signal RHIT <7:0> of the redundant main word line remains the 'L' (Hit) output which is the default state. Also, by this 'L' (Hit) output, the activation/inactivation signal RXRHITB from the relief determination circuit 12 to the memory mat also remains the 'L' (Hit) output, and thus, the redundant memory mat 14a is activated and the normal memory mat 14 is inactivated.

Then, when the selection signal RMACTB of the redundant memory mat 14a by the predecoder circuit 11 is received in the state where the activation/inactivation signal RXRHITB remains the 'L' (Hit) output, only the redundant memory mat 14a is started by using it as the start signal (second start signal), and the equalizer signal BLREQ of the bit line pair BLRT and BLRB is driven in the redundant memory mat 14a. Thereafter, in the redundant memory mat 14a, the sub-word line SWLR is activated, the sense amplifier SA is activated by driving the common source lines PCSR and NCSR of the sense amplifier SA, and the data of the bit line pair BLRT and BLRB is amplified.

Here, in the operation described above, the relationship of the timing between the output of the predecoder circuit 11 and the output of the relief determination circuit 12 will be summarized as follows. That is, after generating each selection signal (AXn, MSBn) from the predecoder circuit 11 to the normal memory mat 14, the activation/inactivation signal RXRHITB is generated from the relief determination circuit 12 to the normal memory mat 14 and the redundant memory mat 14a. Thereafter, the selection signal RMACTB of the redundant memory mat is generated from the predecoder circuit 11 to the redundant memory mat 14a.

As described above, in the operation shown in FIG. 5, only the normal word line is activated at the time of MissHit and only the redundant word line is activated at the time of Hit. Therefore, the problem of the prior art caused by the activation of the defective word line can be prevented. Also, since only one of the word lines is activated, the power consumption can be reduced. Furthermore, since the decoding of the address and the relief determination are performed at the same time, the high-speed operation can be achieved.

In addition, since the activation of the redundant memory mat is certainly delayed from the activation of the normal memory mat, the malfunction that the redundant memory mat and the normal memory mat are selected at the same time can be prevented. As a result, however, there is fear that the operation delay occurs when the redundant memory mat is used. For its prevention, as described in FIG. 3, since the length of the bit lines BLRT and BLRB of the redundant memory mat 24a is reduced, the configuration of the redundant memory mat 24a is separated, and the shared circuit is omitted, the operation delay can be compensated as shown in FIG. 6.

Figure 6:
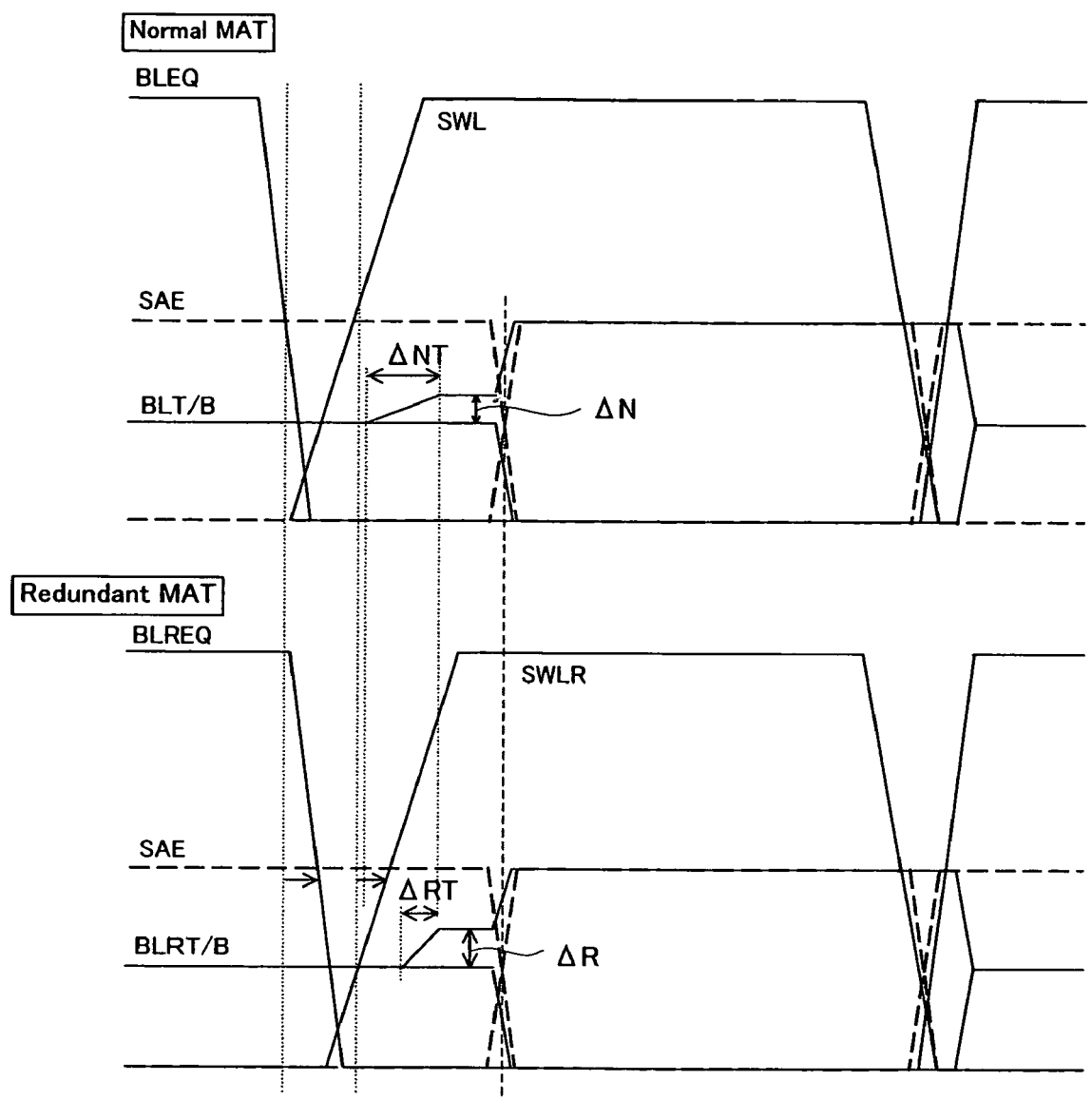
FIG. 6 is a waveform diagram for describing an example of the effect obtained by using the configuration of the memory mat and the sense amplifier region shown in FIG. 3.

FIG. 6 is a waveform diagram for describing an example of the effect obtained by using the configuration of the memory mat and the sense amplifier region shown in FIG. 3. FIG. 6 shows a part of the read waveform to each of the normal memory mat 24 and the redundant memory mat 24a shown in FIG. 3.

First, in the normal memory mat 24, the normal memory mat 24 is started by the equalizer signal BLEQ. Then, by activating the sub-word line SWL, the signal amount ΔN is read in the time ΔNT from the memory cell MC to the bit line pair BLT/B, and when the signal amount reaches the sufficient level, the enable signal SAE of the sense amplifier SA is generated. Then, the signal of the bit line pair BLT/B is amplified by the sense amplifier SA.

Meanwhile, in the redundant memory mat 24a, the redundant memory mat 24a is started by the equalizer signal BLREQ which is delayed from that of the normal memory mat 24. Then, by activating the redundant sub-word line SWLR delayed from the normal memory mat 24, the signal amount ΔR is read in the time ΔRT from the memory cell MCR to the bit line pair BLRT/B, and when the signal amount reaches the sufficient level, the enable signal SAE of the sense amplifier SA is generated. Then, the signal of the bit line pair BLRT/B is amplified by the sense amplifier SA.

In this case, the activation of the sub-word line SWLR is delayed in the redundant memory mat 24a. However, since the shared circuit is omitted, the read time ΔRT of the signal to the bit line pair BLRT/B can be reduced, and since the length of the bit line pair BLRT/B is reduced, the read amount ΔR can be increased. Therefore, even if the enable signal SAE of the sense amplifier is set at the same timing in the normal memory mat 24 and the redundant memory mat 24a, the operation can be performed without any trouble. More specifically, the high-speed operation equivalent to that of the normal memory mat 24 can be performed in the redundant memory mat 24a.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the semiconductor memory device of the DDR system is taken as an example in FIG. 1. However, the present invention is not limited to this, and can be applied to an ordinary DRAM such as SDRAM and SRAM. Also, the block configuration relative to the defect relief in FIG. 2 and the operation waveform showing the operation thereof in FIG. 5 are not limited to these, and other configuration and operation are also available as long as the start of the redundant memory mat is delayed from the start of the normal memory mat. Furthermore, if the desired operation can be acquired by either of the reduction of the bit line length or the omission of the shared circuit, it is not always necessary to provide both of them in the configuration of the redundant memory mat in FIG. 3.

The effect obtained by the representative one of the inventions disclosed in this application will be briefly described as follows.

The start of the redundant memory mat is delayed from the start of the normal memory mat, and this start delay is compensated by the increase of the read signal amount to the bit line of the redundant memory mat and the reduction of the bit line capacitance. Consequently, the reliability when driving the word line can be improved, and the access delay due to the defect relief can be reduced.

The semiconductor memory device according to the present invention is particularly effective when applied to the high-speed memory of the DDR system. In addition to this, the semiconductor memory device according to the present invention can be widely applied to various memory products in which the high-speed operation and highly reliable operation are required such as a cache memory, a memory embedded system LSI, and a non-volatile memory.

What is claimed is:

1. A semiconductor memory device, comprising:
   a memory mat including a first word line, a first bit line, and a first memory cell;
   a redundant memory mat including a second word line, a second bit line, and a second memory cell, said redundant memory mat relieving defects in said memory mat;
   a first sense amplifier region including a first sense amplifier to amplify a signal of said first bit line and provided adjacent to said memory mat; and
   a second sense amplifier region including a second sense amplifier to amplify a signal of said second bit line and provided adjacent to said redundant memory mat,
   wherein said redundant memory mat is not provided with a shared circuit in said second sense amplifier region, and thus, configuration of said redundant memory mat is separated from that of said memory mat.

2. The semiconductor memory device according to claim 1, wherein said second bit line is shorter than said first bit line.

3. The semiconductor memory device according to claim 2, wherein said semiconductor memory device performs an operation of a double data rate system.

4. The semiconductor memory device according to claim 1, wherein said semiconductor memory device performs an operation of a double data rate system.

5. A semiconductor memory device, comprising:

a memory mat including a first word line, a first bit line, and a first memory cell; and a redundant memory mat including a second word line, a second bit line, and a second memory cell, said redundant memory mat relieving defects in said memory mat, wherein said second bit line is shorter than said first bit line, and said semiconductor memory device performs an operation of a double data rate system.

* * * * *